(12) United States Patent
Ten Berge

(10) Patent No.: US 7,927,090 B2
(45) Date of Patent: Apr. 19, 2011

(54) IMPRINT LITHOGRAPHIC APPARATUS, DEVICE MANUFACTURING METHOD AND DEVICE MANUFACTURED THEREBY

(75) Inventor: Peter Ten Berge, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 432 days.

(21) Appl. No.: 11/659,819

(22) PCT Filed: Jun. 30, 2005

(86) PCT No.: PCT/IB2005/002359
§ 371 (c)(1),
(2), (4) Date: Feb. 9, 2007

(87) PCT Pub. No.: WO2006/024908
PCT Pub. Date: Mar. 9, 2006

(65) Prior Publication Data
US 2007/0266875 A1 Nov. 22, 2007

(51) Int. Cl.
*B29C 35/08* (2006.01)
*B29C 59/00* (2006.01)
*B28B 17/00* (2006.01)
*G01B 11/00* (2006.01)

(52) U.S. Cl. ............ 425/150; 425/174.4; 425/385; 264/293; 356/400; 356/620

(58) Field of Classification Search .......... 425/385, 425/174.4, 150; 356/400, 620; 264/293
See application file for complete search history.

(56) References Cited

U.S. PATENT DOCUMENTS

| | | | |
|---|---|---|---|
| 4,650,983 A | 3/1987 | Suwa | |
| 5,300,786 A | 4/1994 | Brunner et al. | |
| 6,136,481 A | 10/2000 | Aoki | |
| 6,696,220 B2 * | 2/2004 | Bailey et al. | 425/385 |
| 6,936,385 B2 | 8/2005 | Lof et al. | |
| 2002/0109825 A1 * | 8/2002 | Gui et al. | 355/53 |
| 2002/0167649 A1 | 11/2002 | Heinle | |
| 2004/0021078 A1 * | 2/2004 | Hagler | 250/339.13 |
| 2004/0021254 A1 | 2/2004 | Sreenivasan et al. | |
| 2004/0142575 A1 * | 7/2004 | Brewer | 438/700 |

(Continued)

FOREIGN PATENT DOCUMENTS
EP 1341046 A 9/2003
(Continued)

OTHER PUBLICATIONS

Islam R et al., "One Micron Precision Optically Aligned Method for Hot-Embossing and Nonoirnprinting," Proceedings of IEEE Sensors 2002 in IEEE International Conferences on Senors, vol. 1, conf. 1, pp. 931-935, Jun. 2002.

(Continued)

*Primary Examiner* — Maria Veronica D Ewald
(74) *Attorney, Agent, or Firm* — Pillsbury Winthrop Shaw Pittman LLP

(57) ABSTRACT

An imprint lithography apparatus is disclosed, the apparatus including a substrate table arranged to support a substrate having a first surface to be imprinted and a second surface, facing the substrate table, comprising a substrate alignment mark, a template holder arranged to hold a template to imprint the first surface of the substrate, and an alignment system arranged to align the template to a substrate alignment mark provided on the substrate, wherein the substrate table further comprises a substrate table optical system to allow the substrate alignment mark to be viewed by the alignment system.

14 Claims, 13 Drawing Sheets

U.S. PATENT DOCUMENTS

2005/0146721 A1* 7/2005 Consolini et al. ............. 356/399
2005/0185169 A1* 8/2005 McMackin et al. ........ 356/237.1

FOREIGN PATENT DOCUMENTS

| | | |
|---|---|---|
| JP | 01-214040 A | 8/1989 |
| JP | 05-114543 A | 5/1993 |
| JP | 09-115812 A | 5/1997 |
| JP | 2000-040649 A | 2/2000 |
| JP | 2002-280299 A | 9/2002 |
| JP | 2004-045933 A | 2/2004 |

OTHER PUBLICATIONS

English translation of Japanese Official Action issued on Jul. 2, 2008 in related Japanese Application No. 2005-230602.

English Translation of Taiwanese Official Action and Search Report issued on Sep. 26, 2008 in Taiwanese Application No. 094122207.

* cited by examiner

IMPRINT LITHOGRAPHIC APPARATUS, DEVICE MANUFACTURING METHOD AND DEVICE MANUFACTURED THEREBY

CROSS REFERENCE TO RELATED APPLICATIONS

This application is the U.S. National Phase of PCT/IB2005/002359, filed Jun. 30, 2005, which in turn claims benefit and priority to U.S. patent application Ser. No. 10/964,814, filed Oct. 15, 2004, and U.S. patent application Ser. No. 10/914,604, filed Aug. 10, 2004, each of the foregoing applications hereby incorporated in their entirety by reference.

FIELD

The present invention relates to imprint lithography. Specifically, the present invention relates to an imprint lithographic apparatus, a device manufacturing method and a device manufactured thereby.

BACKGROUND

A lithographic apparatus is a machine that applies a desired pattern onto a target portion of a substrate. Lithographic apparatus are conventionally used, for example, in the manufacture of integrated circuits (ICs), flat panel displays and other devices involving fine structures.

It is desirable to reduce the size of features in a lithographic pattern because this allows for a greater density of features on a given substrate area. In photolithography, the increased resolution may be achieved by using light of shorter wavelength. However, there are problems associated with such reductions. Current systems are starting to adopt optical sources with wavelengths in the 193 nm regime but even at this level, diffraction limitations become a barrier. At lower wavelengths, the transparency of materials is very poor. Optical lithography machines capable of enhanced resolutions require complex optics and rare materials and are consequently very expensive.

An alternative for printing sub-100 nm features, known as imprint lithography, comprises transferring a pattern to a substrate by imprinting a pattern into an imprintable medium using a physical mould or template. The imprintable medium may be the substrate or a material coated on to a surface of the substrate. The imprintable medium may be functional or may be used as a "mask" to transfer a pattern to an underlying surface. The imprintable medium may for instance be provided as a resist deposited on a substrate such as a semiconductor material to which the pattern defined by the template is to be transferred. Imprint lithography is thus essentially a moulding process on a micrometer or nanometer scale in which the topography of a template defines the patterns created on a substrate. Patterns may be layered as with optical lithography processes so that in principle imprint lithography could be used for such applications as IC manufacture.

The resolution of imprint lithography is limited only by the resolution of the template fabrication process. For instance, imprint lithography has been used to produce features in the sub-50 nm range with significantly improved resolution and line edge roughness compared to that achievable with conventional optical lithography processes. In addition, imprint processes do not require expensive optics, advanced illumination sources or specialised resist materials typically required by optical lithography processes.

Current imprint lithography processes do have a number of drawbacks as will be mentioned below, particularly with regard to achieving overlay accuracy and high throughput. However the significant improvements in resolution and line edge roughness attainable from imprint lithography are strong drivers for addressing these and other problems.

A problem that may arise in imprint lithography is that it may be difficult to align the template to the substrate. These difficulties may be caused by processing layers being present above the alignment marks.

SUMMARY

According to a first aspect of the present invention there is provided an imprint lithography apparatus comprising:

a substrate table arranged to support a substrate having a first surface to be imprinted and a second surface to face the substrate table;

a template holder arranged to hold a template to imprint the first surface of the substrate; and an alignment system arranged to align the template to a substrate alignment mark provided on the substrate;

wherein the substrate alignment mark is provided on the second surface of the substrate, and the substrate table further comprises a substrate table optical system to allow the substrate alignment mark to be viewed by the alignment system.

According to a further aspect of the present invention there is provided a device manufacturing method comprising:

providing a template held in a template holder;

supporting a substrate on a substrate table, the substrate having a first surface to be imprinted and a second surface that faces the substrate table, the substrate further comprising a substrate alignment mark on the second surface; and using a substrate table optical system to view the substrate alignment mark; and aligning the template to the substrate alignment mark.

According to yet another aspect of the present invention there is provided a device manufactured in accordance with the above method.

An embodiment of the present invention is applicable to any imprint lithography process in which a patterned template is imprinted into an imprintable medium in a flowable state, and for instance can be applied to hot and UV imprint lithography as described above.

Further features of the present invention will be apparent from the following description.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE DRAWINGS

There are two principal approaches to imprint lithography, which will be termed generally as hot imprint lithography and UV imprint lithography. There is also a third type of "printing" lithography known as soft lithography. Examples of these are illustrated in FIGS. 1a to 1c.

Figure 1A:
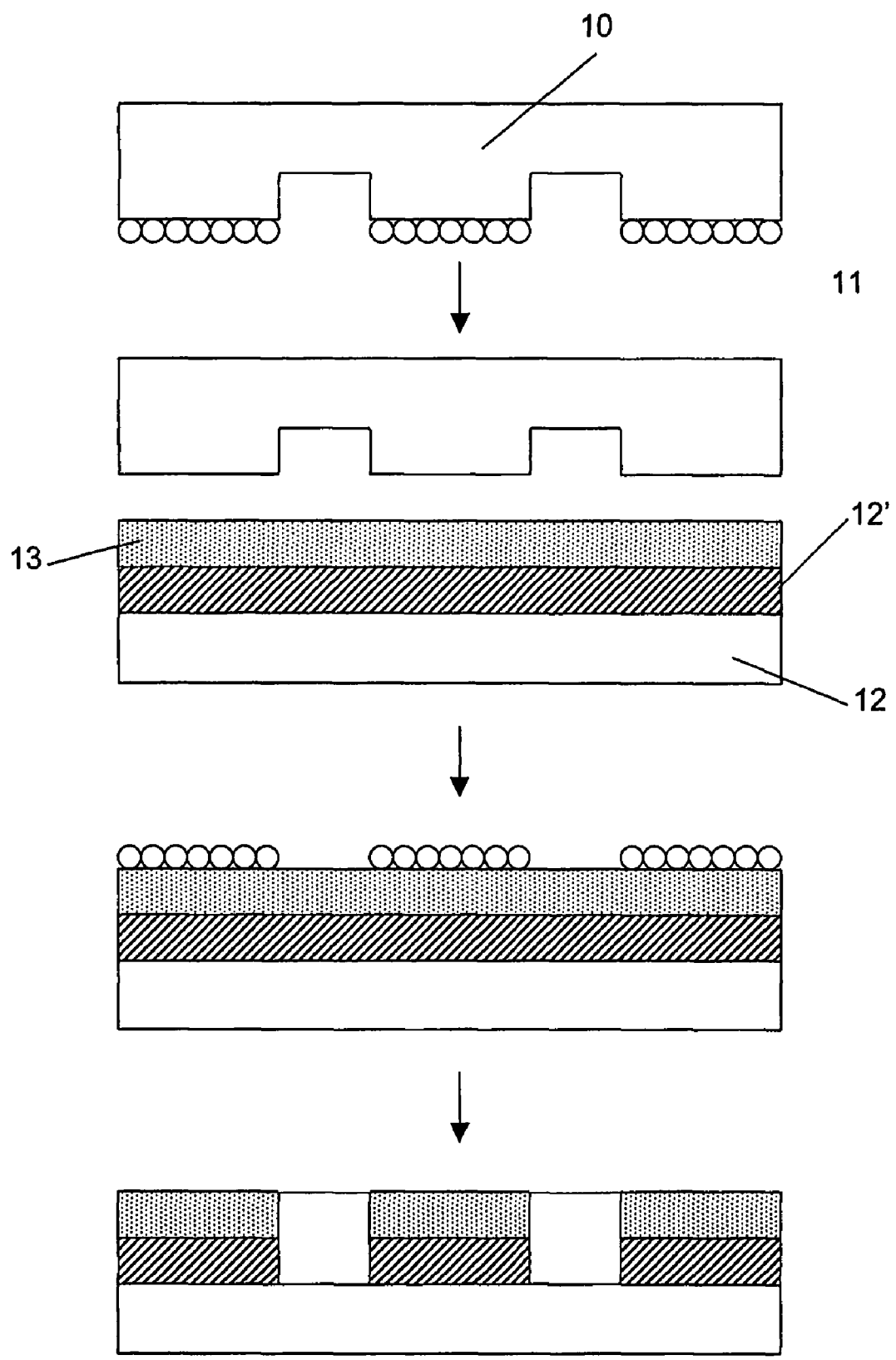
FIGS. 1A-1C illustrate examples of conventional soft, hot and UV lithography process respectively.
Figure 1B:
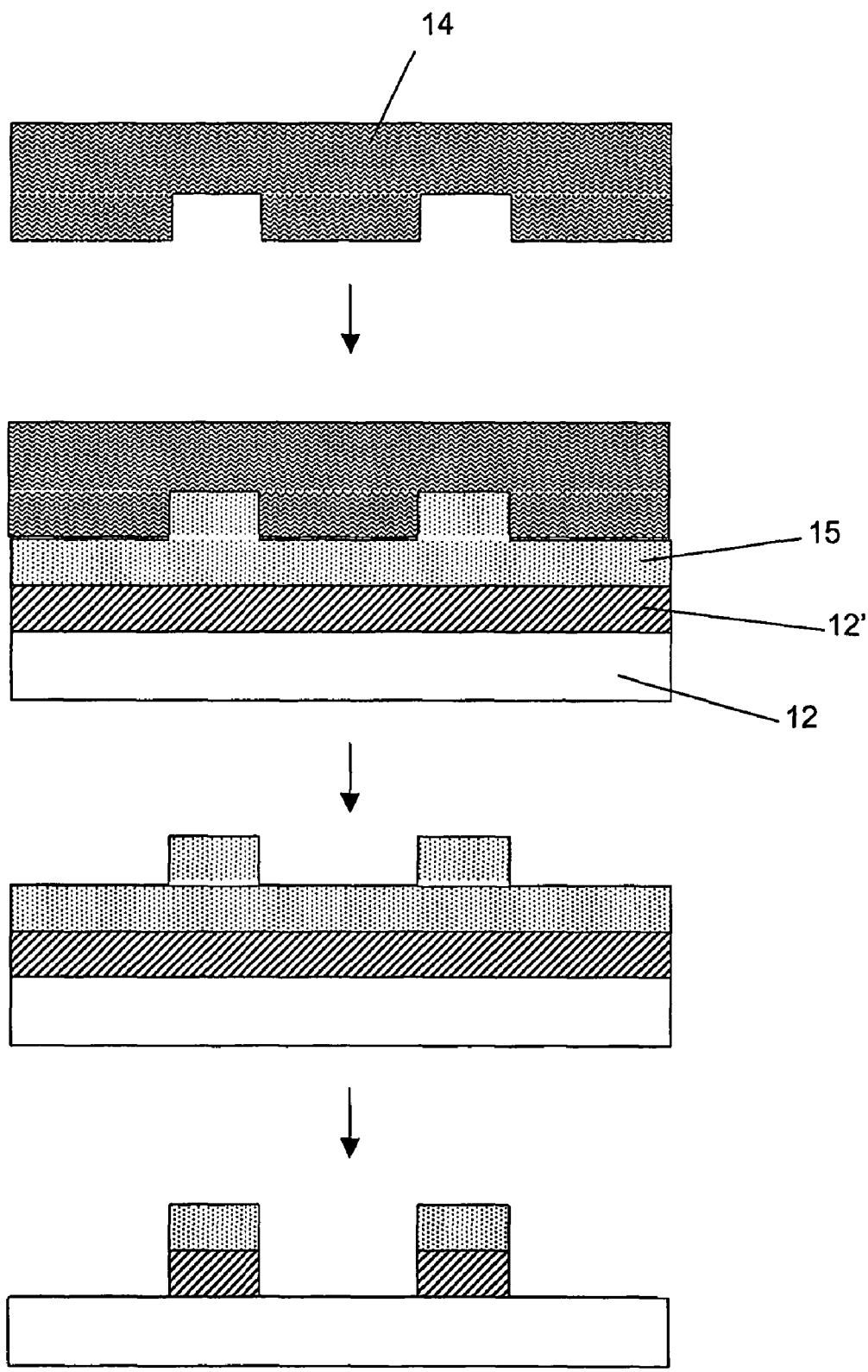
Figure 1C:
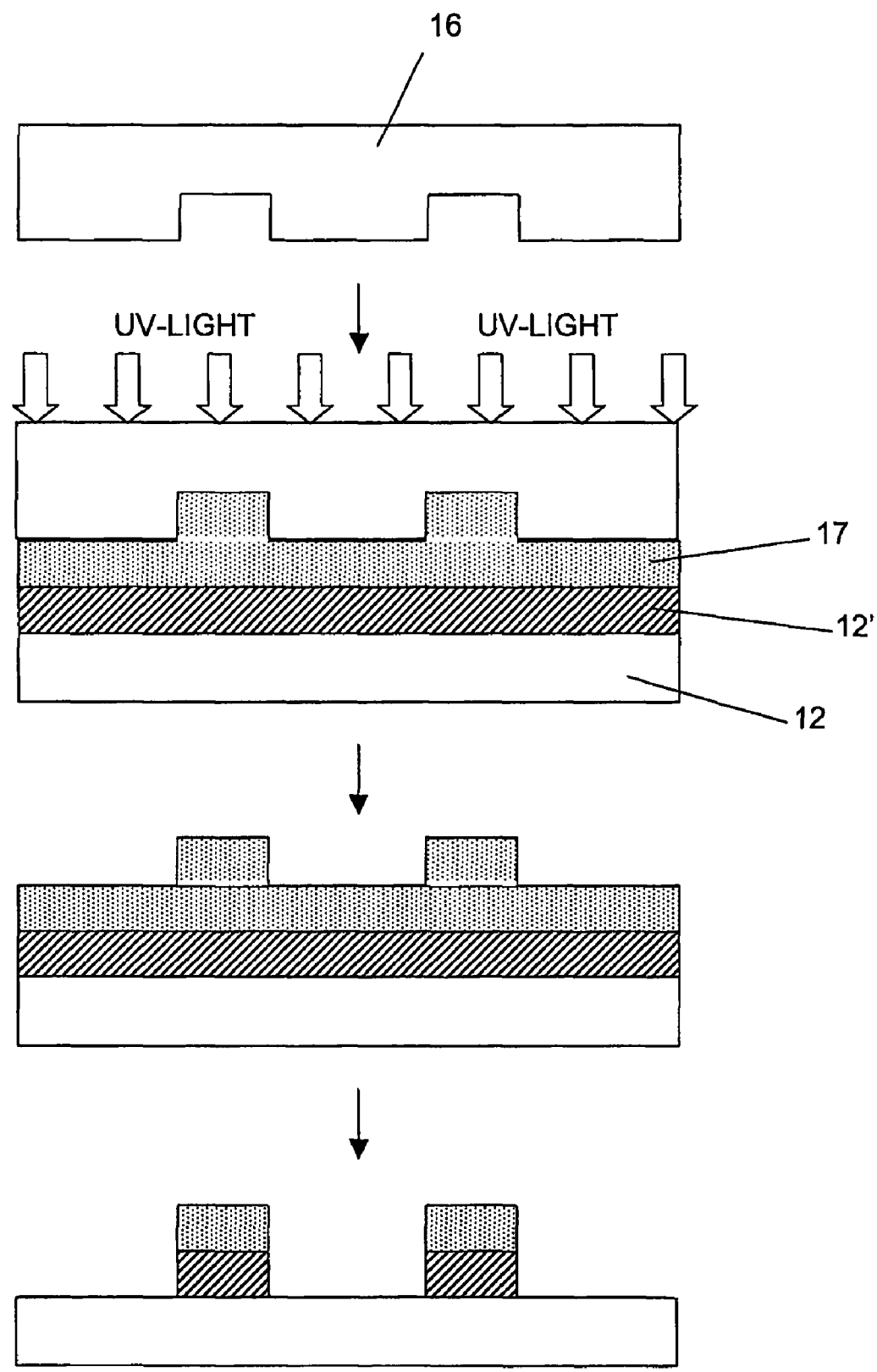

FIG. 1a shows the soft lithography process which involves transferring a layer of molecules 11 (typically an ink such as a thiol) from a flexible template 10 (typically fabricated from PDMS) onto a resist layer 13, which is supported upon a substrate 12, and planarisation and transfer layer 12'. The template 10 has a pattern of features on its surface, the molecular layer being disposed upon the features. When the template is pressed against the resist layer, the layer of molecules 11 stick to the resist. Upon removal of the template from the resist, the layer of molecules 11 remain on the resist. The residual layer of resist is etched such that the areas of the resist not covered by the transferred molecular layer are etched down to the substrate.

The template used in soft lithography may be easily deformed and may therefore not be suited to high resolution applications, e.g. on a nanometer scale, since the deformation of the template may adversely affect the imprinted pattern. Furthermore, when fabricating multiple layer structures, in which the same region will be overlaid multiple times, soft imprint lithography may not provide overlay accuracy on a nanometer scale.

Hot imprint lithography (or hot embossing) is also known as nanoimprint lithography (NIL) when used on a nanometer scale. The process uses harder templates made from, for example, silicon or nickel, which are more resistant to wear and deformation. This is described for instance in U.S. Pat. No. 6,482,742 and illustrated in FIG. 1b. In a typical hot imprint process a solid template 14 is imprinted into a thermosetting or a thermoplastic polymer resin 15, which has been cast on the surface of a substrate 12. The resin may for instance be spin coated and baked onto the substrate surface or more typically (as in the example illustrated) onto a planarisation and transfer layer 12'. It shall be understood that the term "hard" when describing a template includes materials, which may generally be considered between "hard" and "soft" materials, such as for example "hard" rubber. The suitability of a particular material for use as a template is determined by its application requirements.

When a thermosetting polymer resin is used the resin is heated to a temperature such that, upon contact with the template, the resin is sufficiently flowable to flow into the pattern features defined on the template. The temperature of the resin is then increased to thermally cure (e.g. crosslink) the resin so that it solidifies and irreversibly adopts the desired pattern. The template may then be removed and the patterned resin cooled.

Examples of thermoplastic polymer resins used in hot imprint lithography processes are poly (methyl methacrylate), polystyrene, poly (benzyl methacrylate) or poly (cyclohexyl methacrylate). The thermoplastic resin is heated so that it is in a freely flowable state immediately prior to imprinting with the template. It is typically necessary to heat thermoplastic resins to temperatures considerably above the glass transition temperature of the resin. The template is pressed into the flowable resin and sufficient pressure is applied to ensure the resin flows into all the pattern features defined on the template. The resin is then cooled to below its glass transition temperature with the template in place whereupon the resin irreversibly adopts the desired pattern. The pattern will consist of the features in relief from a residual layer of the resin which may then be removed by an appropriate etch process to leave only the pattern features.

Upon removal of the template from the solidified resin, a two-step etching process is performed as illustrated in FIGS. 2a to 2c. The substrate 20 has a planarisation and transfer layer 21 immediately upon it, as shown in FIG. 2a. The purpose of the planarisation and transfer layer is twofold. It acts to provide a surface parallel to that of the template, which is important to ensure that the contact between the template and the resin is parallel, and also to improve the aspect ratio of the printed features, as will be described below.

After the template has been removed, a residual layer 22 of the solidified resin is left on the planarisation and transfer layer, shaped in the desired pattern. The first etch is isotropic and removes parts of the residual layer, resulting in a poor aspect ratio of features where L1 is the height of the features 23, as shown in FIG. 2b. The second etch is anisotropic (or selective) and improves the aspect ratio. The isotropic etch removes those parts of the planarisation and transfer layer which are not covered by the solidified resin, increasing the aspect ratio of the features 23 to (L2/D), as shown in FIG. 2c. The resulting polymer thickness contrast left on the substrate after etching can be used as for instance a mask for dry etching if the imprinted polymer is sufficiently resistant, for instance as a step in a lift-off process.

Hot imprint lithography suffers from a disadvantage in that not only must the pattern transfer be performed at a higher temperature, but also relatively large temperature differentials might be required in order to ensure the resin is adequately solidified before the template is removed. The temperature differential may be between 35 and 100° C. Differential thermal expansion between for instance the substrate and template can then lead to distortion in the transferred pattern. The problem is exacerbated by the relatively high pressures required for the imprinting step, due the viscous nature of the imprintable materials, which can induce mechanical deformation in the substrate, again distorting the pattern.

UV imprint lithography on the other hand does not involve such high temperatures and temperature changes. Nor does it require such viscous imprintable materials. Rather UV imprint lithography involves the use of a transparent template and a UV-curable liquid, typically a monomer such as an acrylate or methacrylate for example. In general any photopolymerisable material could be used, such as a mixture of monomers and an initiator. The curable liquid may also for instance include a dimethyl siloxane derivative. Such materials are much less viscous than the thermosetting and thermoplastic resins used in hot imprint lithography and consequently move much faster to fill template pattern features. Low temperature and low pressure operation also favours higher throughput capabilities.

An example of a UV imprint process is illustrated in FIG. 1c. A quartz template 16 is applied to a UV-curable imprintable medium 17 in a similar manner to the process of FIG. 1b. Instead of raising the temperature as in hot embossing employing thermosetting resins, or temperature cycling when using thermoplastic resins, UV radiation is applied to the imprintable medium through the quartz template in order to polymerise and thus cure it. Upon removal of the template, the remaining steps of etching the residual layer of resist are the same as for the hot embossing process described above. The UV curable imprintable mediums typically used have a much lower viscosity than typical thermoplastic resins so that lower imprint pressures are required. Reduced physical deformation due to the lower pressures, together with reduced deformation due to high temperatures and temperature changes, makes UV imprint lithography better suited to applications requiring high overlay accuracy. In addition the transparent nature of UV templates can accommodate optical alignment techniques simultaneously to the imprint.

Although this type of imprint lithography mainly uses UV curable materials, and is thus generically referred to as UV imprint lithography, other wavelengths of radiation may be used to cure appropriately selected materials (e.g. activate a polymerisation or cross linking reaction). In general any radiation capable of initiating such a chemical reaction may be used if an appropriate imprintable material is available. Alternative "activating light" may for instance include visible light, infrared radiation, x-ray radiation and electron beam radiation. In the general description above, and below, references to UV imprint lithography and the use of UV radiation are not intended to exclude these and other activating light possibilities.

As an alternative to imprint systems using a planar template, which are maintained parallel to the substrate surface, roller imprint systems have been developed. Both hot and UV roller imprint systems have been proposed in which the template is formed on a roller but otherwise the imprint process is very similar to imprinting using a planar template. Unless the context requires otherwise, references to a template include references to roller templates.

There is a particular development of UV imprint technology known as step and flash imprint lithography (SFIL) which may be used to pattern a substrate in small steps in a similar manner to optical steppers conventionally used in IC manufacture. This involves printing small areas of the substrate at a time by imprinting a template into a UV curable resin, 'flashing' UV radiation through the template to cure the resin beneath the template, removing the template, stepping to an adjacent region of the substrate and repeating the operation. The small field size of such step and repeat processes minimises pattern distortions and CD variations so that SFIL is particularly suited to manufacture of IC and other devices requiring high overlay accuracy.

Although in principle the UV curable resin can be applied to the entire substrate surface, for instance by spin coating, this is problematic due to the volatile nature of UV curable resins.

One approach to addressing this problem is the so-called 'drop on demand' process in which the imprintable medium is dispensed onto a target portion of the substrate in droplets immediately prior to imprinting with the template. The liquid dispensing is controlled so that a predetermined volume of liquid is deposited on a particular target portion of the substrate. The liquid may be dispensed in a variety of patterns and a combination of carefully controlling liquid volume and placement pattern is employed to confine patterning to the target area.

Dispensing the imprintable medium on demand as mentioned is not a trivial matter. The size and spacing of the droplets must be carefully controlled to ensure there is sufficient imprintable medium to fill template features whilst at the same time minimizing excess resin which can be rolled to an undesirably thick or uneven residual layer since as soon as neighbouring drops touch fluid the resin will have nowhere to flow. The problems associated with overly thick or uneven residual layer are discussed below.

Figure 3:
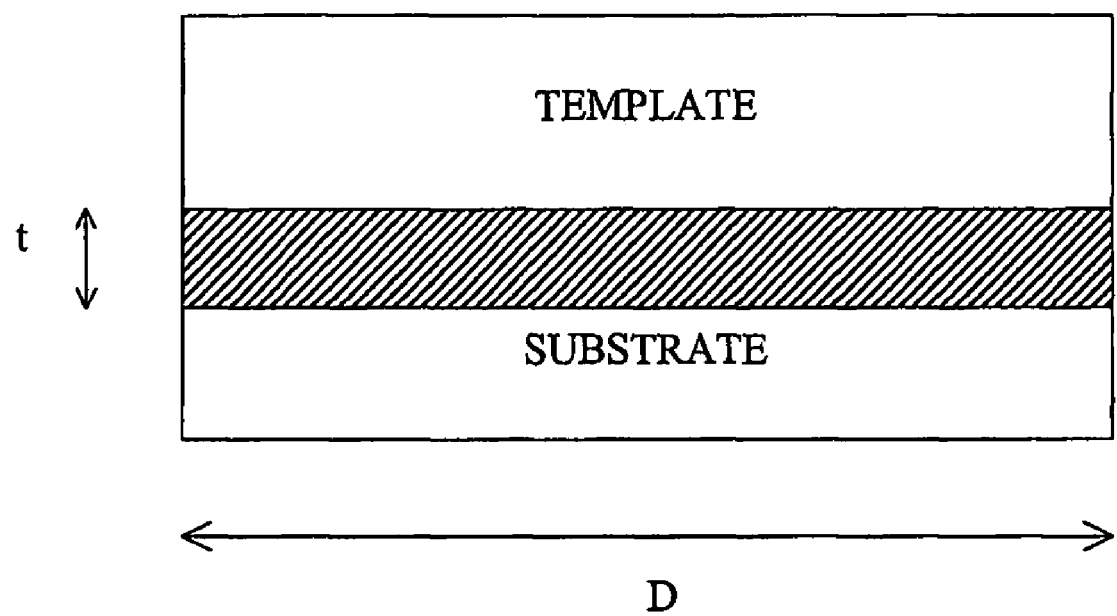
FIG. 3 schematically illustrates a template and a typical imprintable resist layer deposited on a substrate.

FIG. 3 illustrates the relative dimensions of the template, imprintable material (curable monomer, thermosetting resin, thermoplastic etc) and substrate. The ratio of the width of the substrate, D, to the thickness of the curable resin layer, t, is of the order of $10^6$. It will be appreciated that, in order to avoid the features projecting from the template damaging the substrate, the dimension t should be greater than the depth of the projecting features on the template.

The residual layer left after stamping is useful in protecting the underlying substrate, but as mentioned above it is also the source of a number of problems particularly when high resolution and/or overlay accuracy is required. The first 'breakthrough' etch is isotropic (non-selective) and thus to some extent will erode the features imprinted as well as the residual layer. This is exacerbated if the residual layer is overly thick and/or uneven.

This problem can for instance lead to variation in the thickness of lines ultimately formed in the underlying substrate (i.e. variation in the critical dimension). The uniformity of the thickness of a line that is etched in the transfer layer in the second anisotropic etch is dependant upon the aspect ratio and integrity of the shape of the feature left in the resin. If the residual resin layer is uneven, then the non-selective first etch can leave some of these features with "rounded" tops so that they are not sufficiently well defined to ensure good uniformity of line thickness in the second and any subsequent etch process.

In principle the above problem can be reduced by ensuring the residual layer is as thin as possible but this can require application of undesirably large pressures (increasing substrate deformation) and relatively long imprinting times (reducing throughput).

The template is a vital component of the imprint lithography system. As noted above, the resolution of the features on the template surface is a limiting factor on the attainable resolution of features printed on the substrate. The templates used for hot and UV lithography are generally formed in a two-stage process. Initially, the required pattern is written using, for example, electron beam writing, to give a high resolution pattern in resist. The resist pattern is then transferred into a thin layer of chrome which forms the mask for the final, anisotropic etch step to transfer the pattern into the base material of the template. Other techniques such as for example ion-beam lithography, X-ray lithography, extreme UV lithography, epitaxial growth, thin film deposition, chemical etching, plasma etching, ion etching or ion milling could be used. Generally a technique capable of very high resolution will be preferred as the template is effectively a 1× mask with the resolution of the transferred pattern being limited by the resolution of the pattern on the template.

The release characteristics of the template may also be an important consideration. The template may for instance be treated with a surface treatment material to form a thin release layer on the template having a low surface energy (a thin release layer may also be deposited on the substrate).

Although reference is made above to depositing UV curable liquids onto a substrate, the liquids could also be deposited on the template and in general the same techniques and considerations will apply.

Another important consideration in the development of imprint lithography is the mechanical durability of the template. The template is subjected to large forces during stamping of the resist, and in the case of hot lithography, it is also subjected to extremes of pressure and temperature. This will cause wearing of the template, and may adversely affect the shape of the pattern imprinted upon the substrate.

In hot imprint lithography there are potential advantages in using a template of the same or similar material to the substrate to be patterned in order to minimise differential thermal expansion between the two. In UV imprint lithography the template must be transparent to the activation light and accordingly quartz templates are used. Although specific reference may be made in this text to the use of imprint lithography in the manufacture of ICs, it should be understood that imprint apparatus and methods described may have other applications, such as the manufacture of integrated optical systems, guidance and detection patterns for magnetic domain memories, hard disc magnetic media, flat panel displays, thin-film magnetic heads, etc.

Whilst in the description above particular reference has been made to the use of imprint lithography to transfer a template pattern to a substrate via an imprintable resin effectively acting as a resist, in some circumstances the imprintable material may itself be a functional material, for instance having a function such as conductivity, optical linear or non linear response, amongst others. For example the functional material may form a conductive layer, a semiconductive layer, a dielectric layer or a layer having another desirable mechanical, electrical or optical property. Some organic substances may also be appropriate functional materials. Such applications may be within the scope of the present invention.

In a conventional imprint lithography apparatus, a template is provided with a pattern is attached to an actuator. The actuator moves the template towards a substrate, and pushes the template into the substrate. The forces pushing into the substrate via the template are very large. This can cause deformation of the substrate and/or template, for example of a few hundred nanometers, which may lead to damage of the pattern imprinted onto the substrate.

Typically, in the fabrication of a device such as an integrated circuit (IC) or a flat panel display (FPD) multiple layers of patterns are imprinted into the surface of the substrate to build up three dimensional structures. For instance, a first pattern may be imprinted into a layer of resist overlying the upper surface of the substrate. The substrate may then be removed from the lithographic apparatus and processed using conventional processing steps such that the upper portions of the substrate are modified. These processing steps may include etching, ion implantation and deposition of layers of material. The substrate is then returned to the lithographic apparatus to allow a further pattern to be imprinted into the surface of the substrate (or a further layer of resist applied to the surface of the substrate).

In order to apply imprint lithography in mainstream IC or FPD fabrication it is important to ensure that the successive layers of pattern built up on the surface of the substrate are accurately aligned to each other. Before each imprinting step the template must be aligned to the substrate such that the template is in the correct spatial relationship to the existing structures or patterns on the substrate. Alignment is the process of positioning the pattern on a specific point on the template to a specific point on the substrate that is to be imprinted. For forms of imprint lithography such as the SFIL embodiment described above, it is important to ensure that adjacent portions of the pattern are aligned to each other, to ensure a sufficient degree of overlay accuracy.

For mainstream IC fabrication the required overlay and alignment accuracy is typically within a third or a quarter of the minimum resolution of a critical dimension of the pattern, for instance the width of pattern lines. A major advantage of imprint lithography is the ability to achieve very fine resolution of imprinted patterns, for instance lines less than 50 nm wide. Therefore, overlay and alignment accuracy of less than 20 nm is required if such fine resolution is to be employed in mainstream fabrication.

In imprint lithography, a template is aligned to a substrate by using a substrate alignment mark on an upper surface of the substrate (i.e. the surface to be imprinted). The substrate may already have layers or portions of layers of pattern imprinted upon the upper surface. The substrate alignment mark may be a small pattern such as a cross. In one type of alignment system the substrate alignment mark comprises a diffraction grating. The substrate alignment mark can be etched onto the surface of the substrate, or be formed from material deposited onto the surface of the substrate. The substrate alignment mark is in a known fixed spatial relationship to the substrate, and any pattern already imprinted into the surface of the substrate. By referencing the substrate alignment mark to a known point within the lithographic apparatus, correct alignment of the substrate between imprinting steps can be ensured.

Other forms of alignment system for imprint lithography may make use of a template alignment mark. The template alignment mark is in a known fixed spatial relationship to the functional pattern on the template. By referencing the template alignment mark to the substrate alignment mark, overlay and alignment accuracy can be increased. Furthermore, if multiple lithography templates are used, each having a template alignment mark, matching up of different patterns can be ensured. This is important for fabricating multiple layer structures.

In a basic embodiment of an alignment system using both a substrate alignment mark and a template alignment mark, each alignment mark comprises a mark such as a cross. For UV imprint lithography, in which the template is transparent, the template may be positioned over the substrate such that the substrate alignment mark and the template alignment mark line up when viewing the substrate in the Z direction (normal to the plane of the surface of the substrate) through the template. A microscope or other detection system such as a CCD camera is used to check the alignment either by hand or in an automated system. The template (or the substrate) is then moved until the two marks are coincident as viewed by the detection system.

Once the marks are aligned, the spatial relationship between the template and the substrate is known. The template is typically then offset by a predetermined amount using a template handler and used to imprint the functional pattern into the surface of the substrate. The alignment performance for this embodiment of an alignment system is typically around 1 $\mu$m.

For imprint lithography using opaque templates (for instance hot lithography), alignment can be measured by viewing adjacent images of the two alignment marks, for instance using a CCD camera. The offset between the marks can then be measured and compared to a predetermined desired value. Alternatively, radiation from the substrate alignment mark can be reflected off the template alignment mark towards a radiation detector.

In a further embodiment, the substrate alignment mark and the template alignment mark comprise diffraction gratings. An alignment beam is arranged to be incident upon the substrate alignment mark such that an image of the diffraction grating is reflected back towards the template alignment mark. A radiation detector, for instance a photodetector, is arranged to receive the radiation passing through the template alignment mark. Alternatively, for an opaque template, radiation reflected off the template alignment mark can be received. The intensity of the received radiation is a function of the alignment of the two alignment marks. This received intensity signal can be used to control the position of the template relative to the substrate until the two marks are brought into alignment. The alignment performance for this type of alignment system is typically around 500 nm.

Optical alignment techniques for optical lithography offer the prospect of achieving the required accuracy for mainstream fabrication of ICs/FPDs at resolutions of <50 nm. However, an added complication for the use of these techniques is the use of the imprintable medium (e.g. the layer of resin) on the surface of the substrate into which the template is imprinted. This liquid layer is necessarily between the substrate and the template, and as such the alignment beam must pass through this layer of liquid twice before passing to the detection system. The liquid layer distorts the alignment beam, reducing the accuracy of the achievable measurements to below the required accuracy.

One workaround for this distortion uses the drop on demand technique described above in relation to the SFIL imprint lithographic process, in which the imprintable medium is applied to the target portion of the substrate in droplets before each target portion is imprinted in a step and repeat system. In this approach the portion of the substrate to which the imprintable medium is applied is positioned such that the template and substrate alignment marks are not obstructed by the imprintable medium. However, in this drop on demand approach the substrate is typically removed from the lithographic apparatus after each imprinting step to allow the previously deposited imprintable medium to cure. Therefore, the template will have to be realigned to the substrate before each imprinting step for each die. This local alignment approach is inefficient and reduces throughput for the lithographic apparatus.

Processing of the substrate between imprinting steps, such as chemical mechanical polishing (CMP), rapid thermal annealing, thick layer deposition and deep trench etching can damage or distort the substrate alignment mark (or marks). This can cause distortion of the alignment radiation beam reflected from the substrate resulting in an increase of overlay errors over time.

Figure 2:
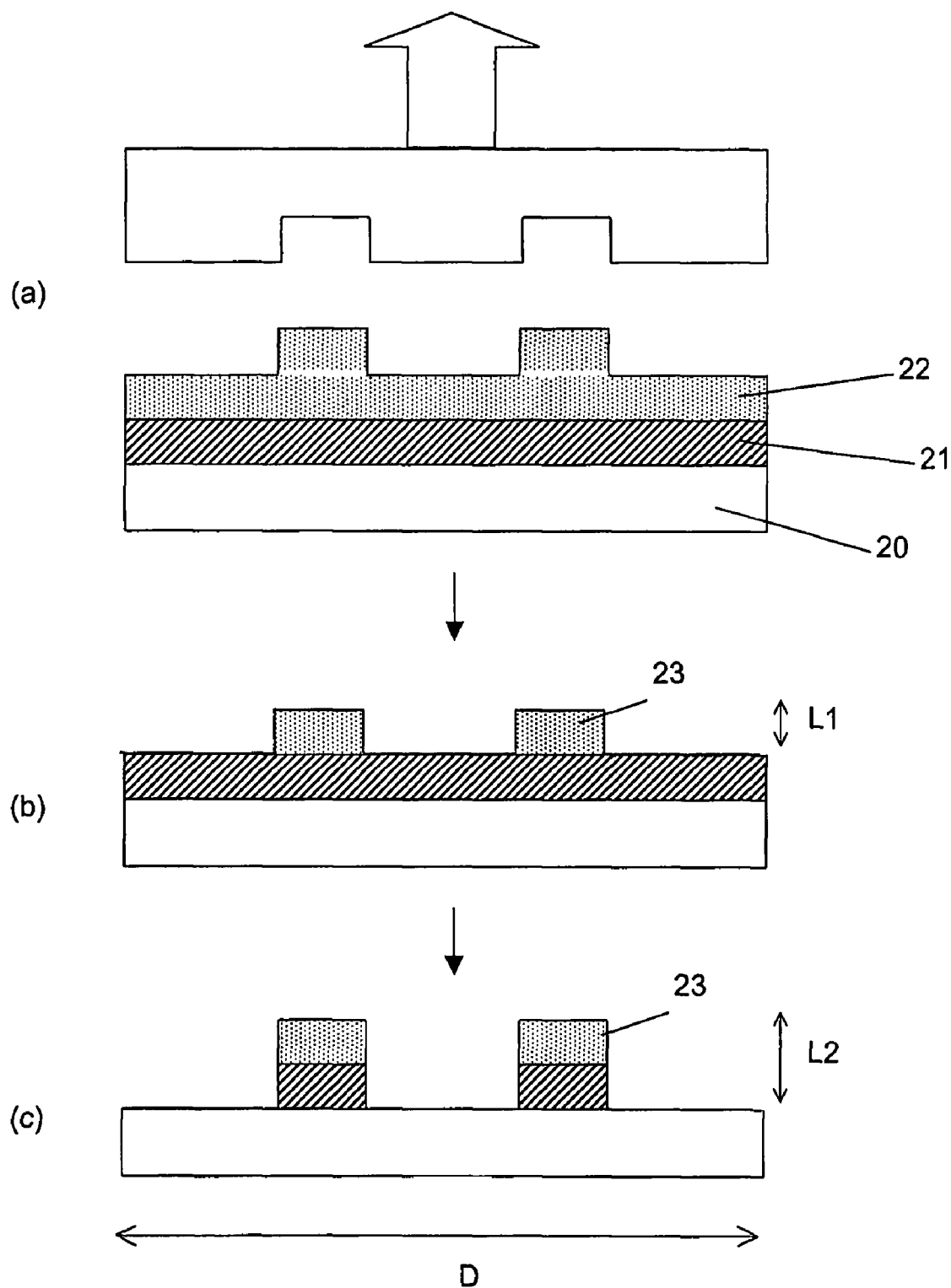
FIG. 2 illustrates a two step etching process employed when hot and UV imprint lithography is used to pattern a resist layer.
Figure 4:
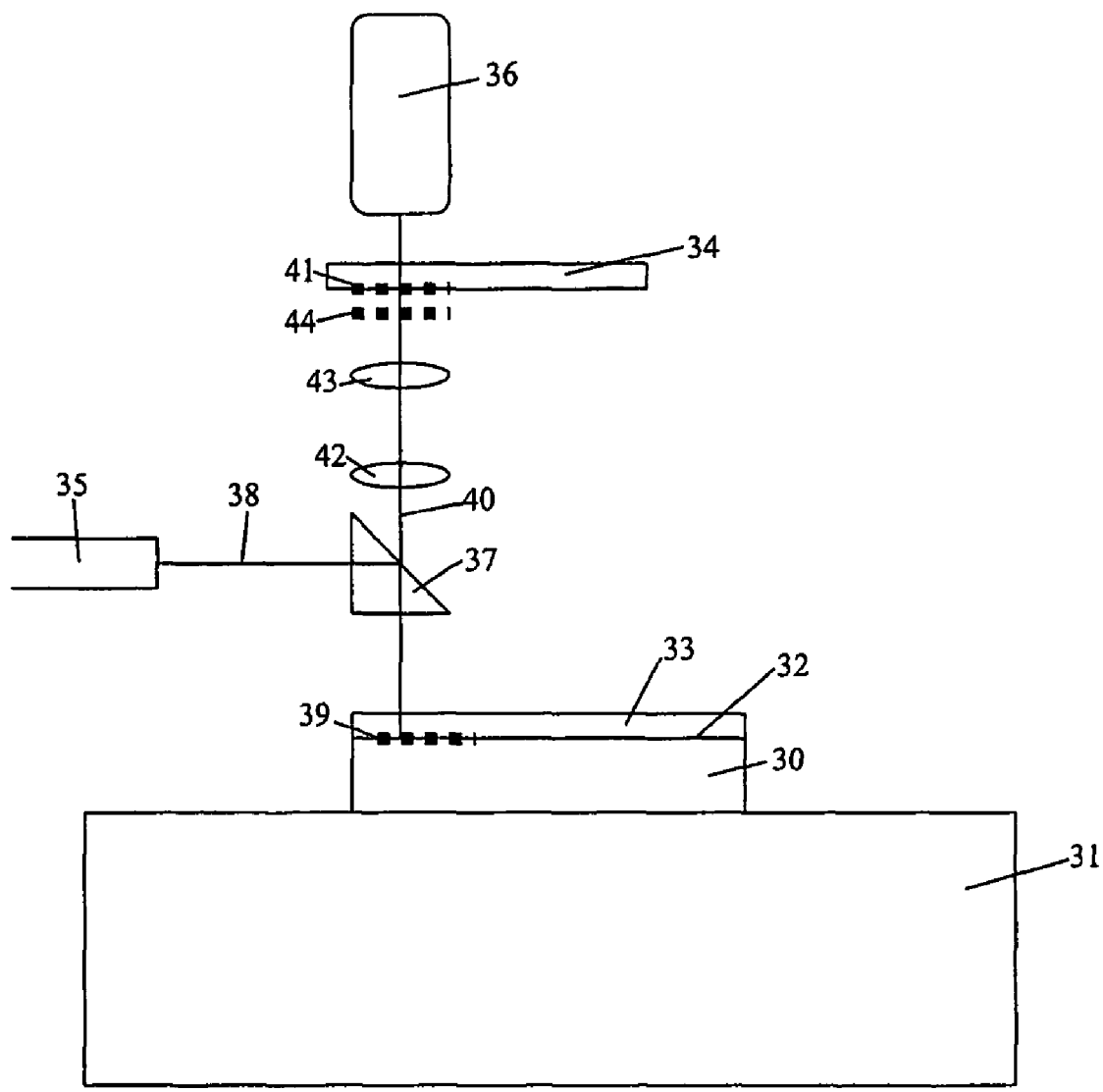
FIG. 4 schematically illustrates an alignment system for imprint lithography.

FIGS. 1 to 3 have been described above. Referring now to FIG. 4, this schematically illustrates a side view in partial cross section of an alignment system for an imprint lithography apparatus. Substrate 30 is supported on substrate table 31. On a first surface 32 of substrate 30 there is disposed a layer of an imprintable medium 33 (for instance a resinous material) to be imprinted with a functional pattern on template 34. The functional pattern is not explicitly shown in FIG. 4 as it is disposed on the lower surface of the template 34 (the surface facing the first surface 32 of the substrate 30).

The alignment system comprises radiation source 35, radiation detector 36 and beam deflection element (e.g., a beam splitter) 37. The radiation source 35 is arranged to provide an alignment beam of radiation 38. The alignment beam 38 is deflected towards the first surface 32 of substrate 30 by beam deflection element 37. Disposed on the first surface 32 of substrate 30 is a substrate alignment mark 39. The substrate alignment mark 39 may, for instance, be a small pattern or a diffraction grating. Throughout this specification, reference to an alignment mark includes the alignment mark being etched into the substrate (or template, as discussed below). Alternatively, the alignment mark may be built up from material deposited on the substrate or template.

The alignment beam 38 is reflected (and possibly diffracted depending upon the form of the alignment mark) back from the substrate alignment mark 39 forming return radiation beam 40. Return radiation beam 40 passes through beam deflection element 37 towards radiation detector 36. It will be appreciated that the beam deflection element 37 may be of any type conventional in the art.

Template 34 is in the path of the return radiation beam 40 between beam deflection element 37 and radiation detector 36. As well as the functional pattern, template 34 also has a template alignment mark 41. The template alignment mark 41 is in a known spatial relationship with the functional pattern on the template. Template alignment mark 41 may typically be the same as the substrate alignment mark 39. Template 34 is transparent, such that the return radiation beam 40 passes through the template. Specifically, return radiation beam 40 passes through the template alignment mark 41 before reaching the radiation detector 36.

The alignment system may further comprise a pair of lenses 42, 43 arranged to focus an image 44 of the substrate alignment mark 39 adjacent to the template alignment mark 41.

Radiation detector 36 is arranged to provide an output signal indicative of the intensity of radiation received from the return radiation beam 40. The received radiation intensity varies according to the relative alignment of the template and substrate alignment marks 39, 41.

In a first embodiment of this alignment system, the template and alignment marks 39, 41 each comprise a two dimensional pattern, for instance a cross. The substrate 30 and the template 34 are moved relative to each other until the alignment marks coincide. This movement may be performed manually (for instance if the radiation detector is a camera connected to a monitor). Alternatively, the alignment may be automated. The template 34 is mounted upon a template handler (not shown). Once the template 34 has been aligned to the substrate 30 the template handler typically offsets the position of the template 34 by a predetermined amount to an imprinting position. The template 34 is then pressed against the substrate 30 in order to transfer the functional pattern to the substrate, as described above in the introduction.

In an alternative embodiment, each alignment mark comprises a diffraction grating. Depending upon the alignment of the template alignment mark 41 and the image 44 of the substrate alignment mark the received radiation intensity at the radiation detector 36 varies as a sine wave (as will be described in more detail below with reference to FIGS. 10 and 11).

The alignment beam 38 (and consequently the return radiation beam 40) may be visible light, infrared or any other form of radiation known in the art for use in alignment systems in lithography. For forms of imprint lithography in which the template is not transparent to the return radiation beam 40 the radiation detector 36 is arranged to receive the return radiation beam 40 after reflection or diffraction from the template alignment mark 41.

Figure 5:
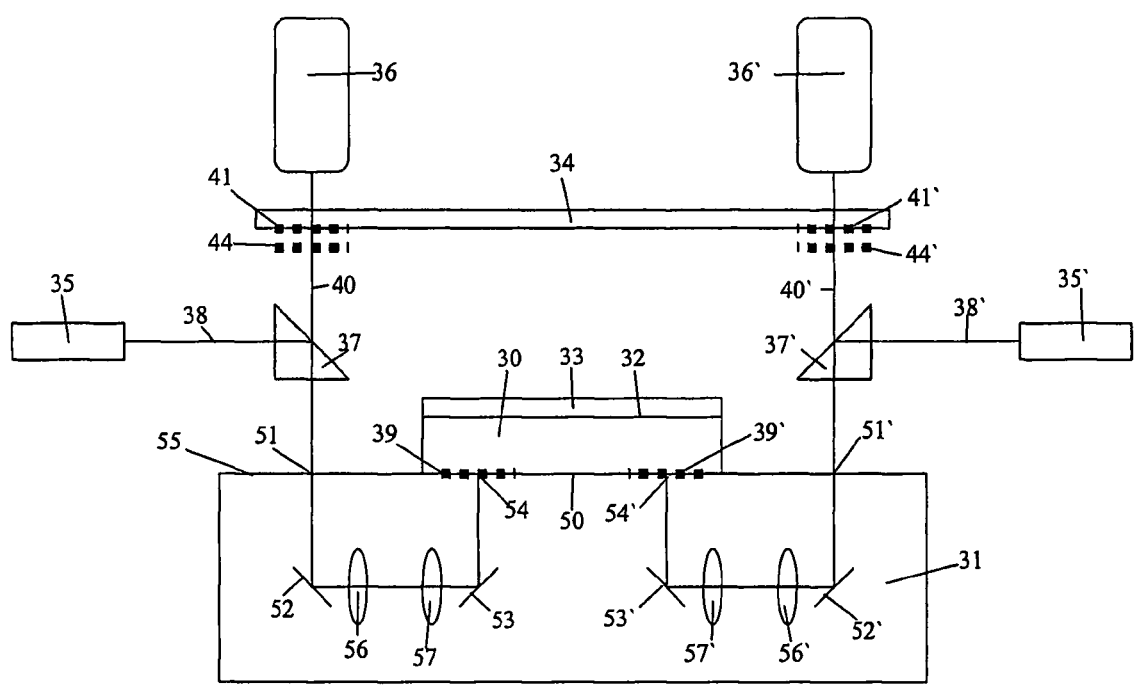
FIG. 5 schematically illustrates an alignment system for imprint lithography in accordance with an embodiment of the present invention.

Referring now to FIG. 5, this illustrates an alignment system for an imprint lithography apparatus in accordance with an embodiment of the present invention. Where components are the same as, or similar to, components depicted in relation to the prior art alignment system of FIG. 4 they are referred to by the same reference numerals.

In the alignment system of FIG. 5, substrate alignment mark 39 is disposed on a second surface 50 of substrate 30. Second surface 50 is the opposite surface of substrate 30 to first surface 32 (the surface into which the functional pattern is imprinted). Second surface 50 faces the substrate table 31. This is advantageous as it means that the layer of imprintable medium 33 on first surface 32, and any further processing of the first surface 32 of the substrate, do not affect alignment mark 39, and hence do not affect the performance of the alignment system.

The imprint lithographic apparatus further comprises a substrate table optical system. The substrate table optical system is arranged to direct the alignment beam of radiation 38 to the substrate alignment mark 39 and direct the return radiation beam 40 to the radiation detector 36. The substrate table optical system comprises a first optical window 51 through which the alignment beam 38 passes. The substrate table optical system is located in an optical cavity within the substrate table 31. The optical windows 51, 54 may comprise a layer of optically transparent material, for instance glass or Perspex. Alternatively, the optical windows may simply comprise openings in the upper surface of the substrate table 31.

The substrate table optical system comprises a pair of mirrors 52 and 53 arranged to deflect the path of the alignment beam 38 from the first optical window 51 to a second optical window 54 proximate the substrate alignment mark 39. Conveniently, the alignment beam 38 is arranged to pass through the first optical window 51 approximately normally to the plane of the upper surface 55 of the substrate table 31. Mirrors 52 and 53 are arranged such that the angles they subtend to a horizontal plane add up to 90° such that as the alignment beam 38 exits the second optical window 54 it exits approximately normally to the plane of the upper surface 55 of the substrate table 31.

The alignment beam 38 is reflected (and possibly diffracted depending upon the form of the alignment mark) by the substrate alignment mark 39. The return radiation beam 40 passes back through the substrate table optical system along substantially the same beam path as the alignment beam of radiation 38. Upon exiting the first optical window 51 the return radiation beam 40 passes through the beam deflection element 37 and is detected by the radiation detector 36. As in FIG. 4, the return radiation beam 40 passes through a template alignment mark 41 disposed upon the template 34. As before, the radiation detector 36 is arranged to provide an output signal indicative of the intensity of the received radiation, which in turn is indicative of the alignment between the substrate alignment mark 39 and the template alignment mark 41.

The substrate table optical system may further comprise a lens arranged to focus the return radiation beam 40 from the substrate alignment mark 39. Advantageously, as illustrated in FIG. 5 the substrate table optical system comprises a pair of lenses 56, 57 arranged to focus the return radiation beam 40 such that an image of the substrate alignment mark 44 is focused adjacent to the template alignment mark 41.

The order of lenses 56, 57 and the mirrors 52, 53 may be different as appropriate to the particular lithographic apparatus. For example, there may only be a single lens, or there may be more than two. Other forms of beam deflecting elements, for instance prisms, may replace the mirrors. One or both lenses may be positioned between mirror 53 and the substrate 30, or above the substrate table 31 (the latter option being shown in conjunction with the prior art alignment system of FIG. 4).

FIG. 5 further shows a mirror image portion of the alignment system (indicated by primed reference numerals). The substrate 30 thus has two substrate alignment marks 39 and 39', and the template 34 has two template alignment marks 41 and 41'. It is advantageous to have two sets of alignment marks when aligning the template 34 to the substrate 31 in order to be able to detect relative expansion or contraction of the substrate. In the case of non-symmetrical expansion/contraction (i.e. the degree of expansion/contraction varies across the area of the substrate) more than two sets of alignment marks distributed over the area of the substrate may be needed to detect and measure this. Additionally, by providing two sets of alignment marks, the alignment system is able to detect rotation of the substrate. Rotation of the substrate could otherwise give rise to orientational overlay errors when imprinting a template onto the surface of a substrate that has already been partially patterned. Aligning a single template alignment mark 41 to a single substrate alignment mark 39 only allows the template 34 to be aligned to the substrate at one point in the planes of each of the template 34 and the substrate 30.

Figure 6:
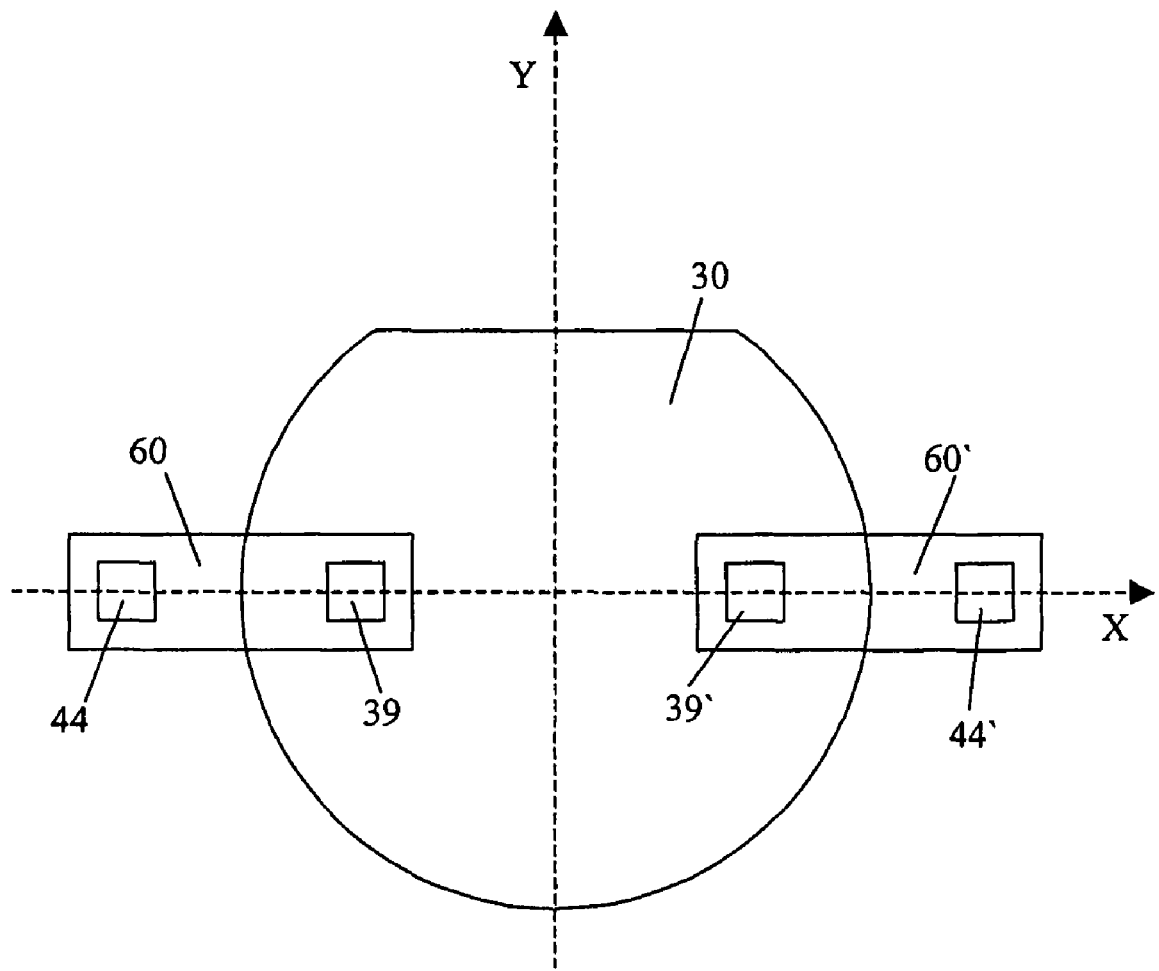
FIG. 6 schematically illustrates in partial cross section a plan view of part of an alignment system in accordance with an embodiment of the present invention.

Referring now to FIG. 6, this illustrates in partial cross section a plan view of part of the alignment system of FIG. 5. Substrate 30 is arranged to lie in an X, Y plane. Substrate alignment marks 39, 39' on the second surface (the backside) of the substrate 30 are disposed upon the X axis at opposite edges of substrate 30. The substrate table optical systems (schematically illustrated by boxes 60, 60') are arranged to provide images 44, 44' of the substrate alignment marks displaced laterally away from the substrate 30 along the X axis. By displacing the images 44, 44' away from the substrate 30 the beam path between the substrate table optical systems 60, 60' and the radiation detectors 36, 36' are not obscured by the substrate 30.

It will be appreciated that the substrate alignment marks 39, 39' may be positioned anywhere on the second surface of the substrate, and are not necessarily aligned with an axis of the substrate 30. Advantageously, the substrate alignment marks 39, 39' are widely separated. This makes it easier to detect orientational errors. Alternatively, there may be more than two substrate alignment marks. The alignment marks may be local to each die within the substrate.

Figure 7:
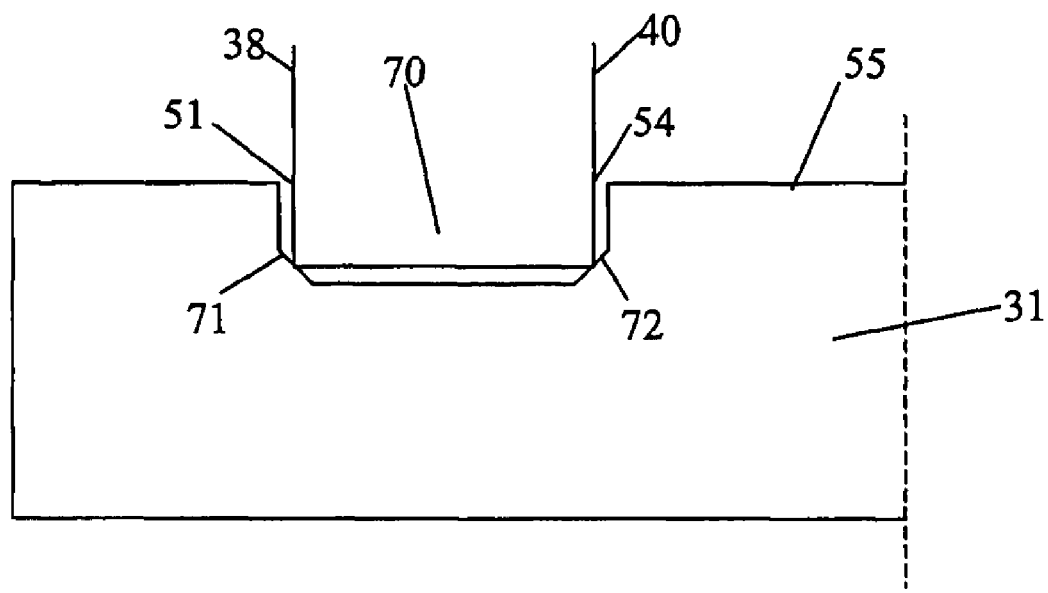
FIG. 7 schematically illustrates in partial cross section a side view of part of an alignment system in accordance with an embodiment of the present invention.

FIG. 7 schematically illustrates a first option for part of a substrate table alignment system. Within substrate table 31 an optical cavity 70 is carved into the upper surface 55. Surfaces 71 and 72 of the optical cavity may be polished to form the mirrors 52, 53 shown in FIG. 5. Alternatively, mirrors 52, 53 may be provided by applying a reflective coating to surfaces 71, 72, or by inserting separately fabricated mirrors. Further components of the substrate table optical system, for instance lenses 56, 57 (not shown in FIG. 7) may be positioned within the optical cavity 70. The upper surface of optical cavity 70 may be provided with a cover (not shown). The cover may be opaque except to provide access for the alignment beam 38 and the return radiation beam 40 at the first and second optical windows 51, 54.

Figure 8:
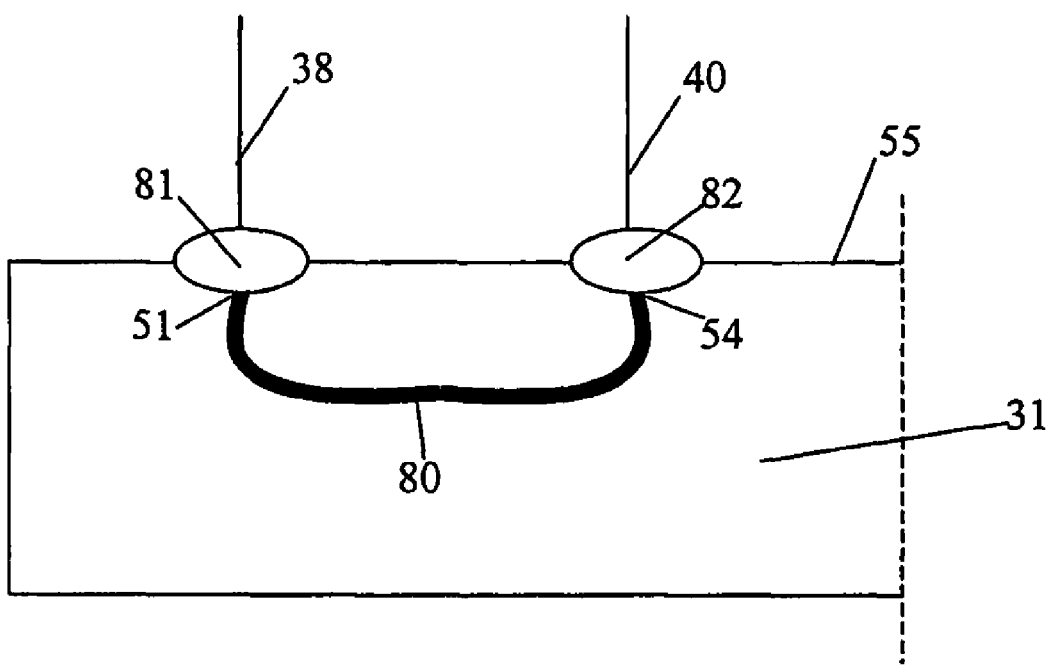
FIG. 8 schematically illustrates in partial cross section a side view of part of an alignment system in accordance with an embodiment of the present invention.

FIG. 8 schematically illustrates an alternative embodiment of the substrate table optical system in accordance with an embodiment of the present invention. Between the first and second optical windows 51, 54 there is provided an optical fibre 80. Optical fibre 80 is arranged to transmit the alignment beam 38 and the return radiation beam 40 between the optical windows 51, 54. Lenses 81 and 82 may be provided at the optical windows 51, 54 in order to focus the return radiation beam, (i.e. the equivalent role to lenses 56, 57 of FIG. 5).

Figure 9A:
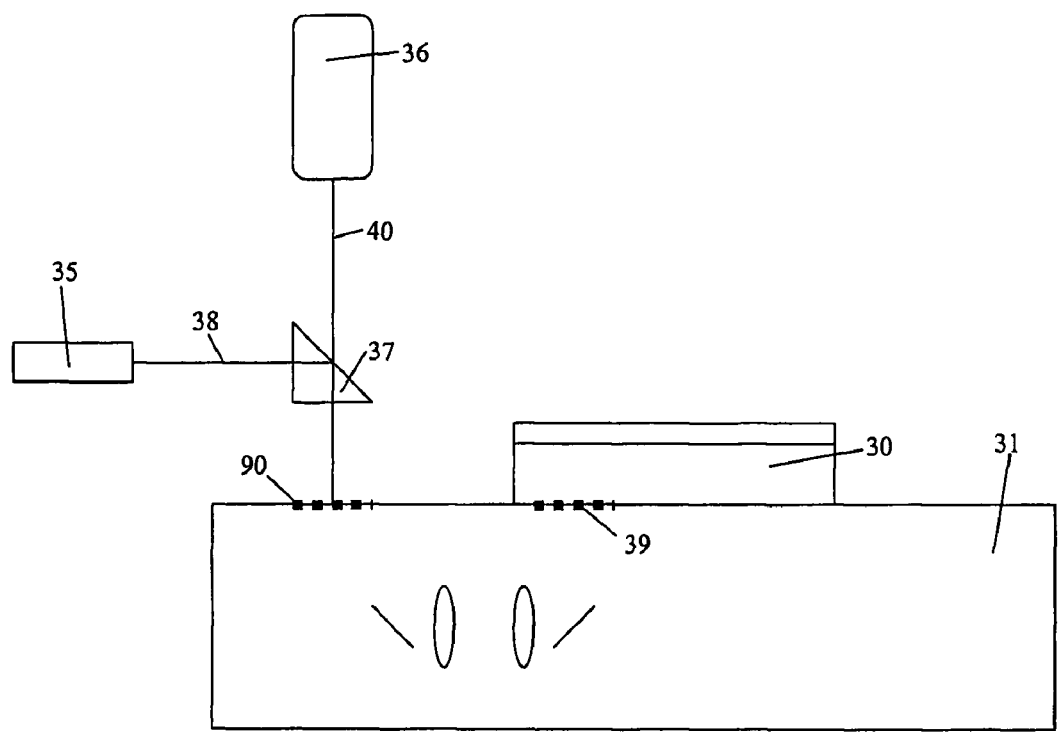
FIGS. 9A to 9C schematically illustrate the operation of part of the alignment system of FIG. 5.
Figure 9B:
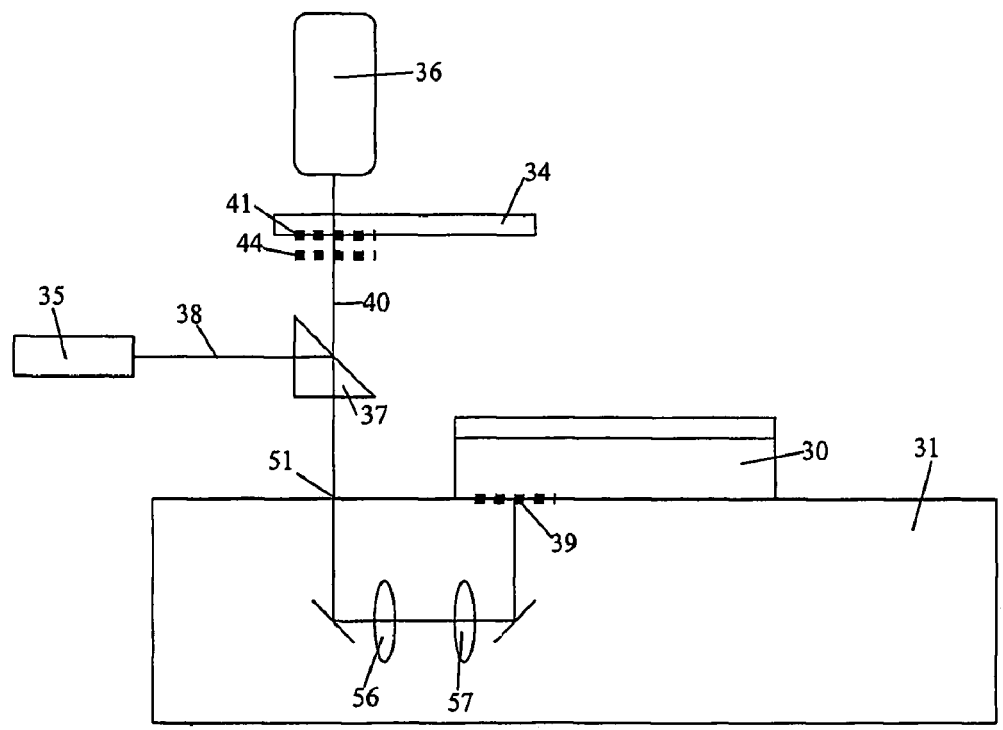
Figure 9C:
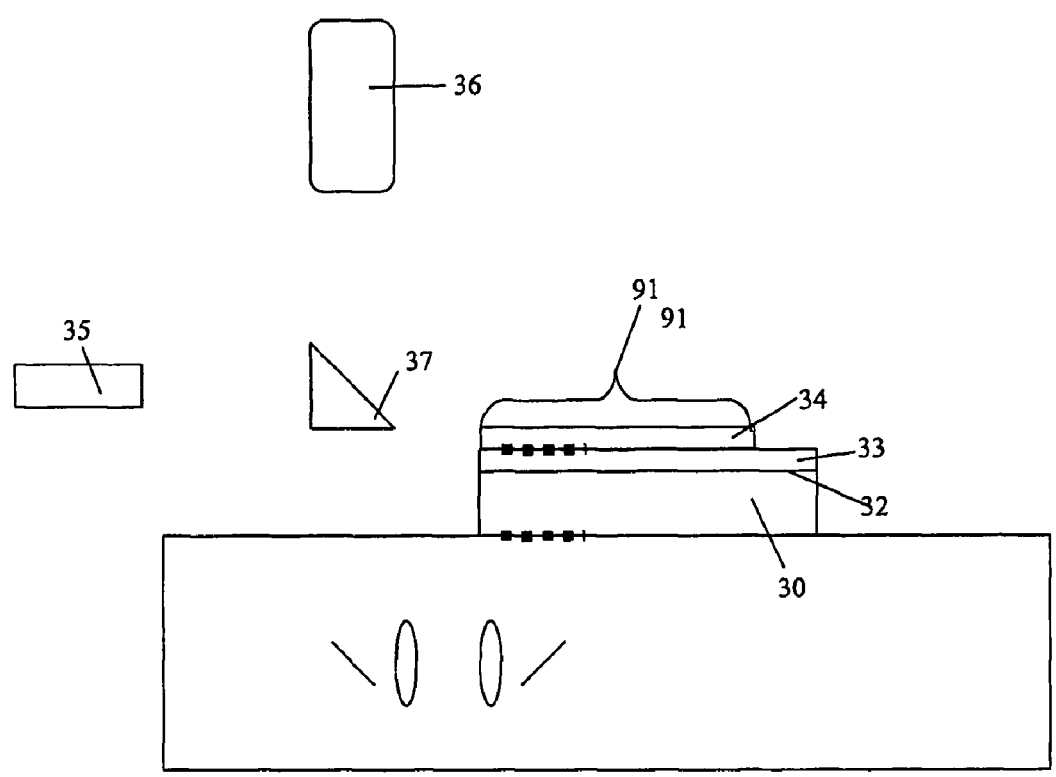

Referring now to FIGS. 9A to 9C, these schematically illustrate a method of aligning a template 34 to a substrate 30 in accordance with an embodiment of the present invention. Components similar to the alignment system of FIG. 5 are referred to using the same reference numerals. For clarity only a single alignment system, operating on a single substrate alignment mark 39 and a single template alignment mark 41, is shown in FIGS. 9A to 9C. However, it will be appreciated that there may be more than one substrate alignment mark and more than one template alignment mark.

In FIG. 9A the alignment system is aligned to the substrate table by directing the alignment beam 38 such that it reflects off a substrate table alignment mark 90. Although this step may be omitted, it is advantageous to align the alignment system to the substrate table 31 as well as aligning the template 34 to the substrate 30, such that both the template 34 and the substrate 30 are aligned to the rest of the lithographic apparatus.

Once the alignment system has been aligned to the substrate table 31 the alignment system or the substrate table 31 is offset such that alignment beam 38 passes through the first optical window 51 into the substrate table optical system. This is depicted in FIG. 9B. As in FIG. 5 the template 34 is positioned such that the template alignment mark 41 is positioned in the path of return radiation beam 40 between the beam deflection element 37 and the radiation detector 36. An image 44 of the substrate alignment mark 39 is focused by lenses 56, 57 such that it is adjacent to the template alignment mark 41.

Once the or each template alignment mark 41 has been aligned to the or each corresponding substrate alignment mark 39, the alignment beam 38 is stopped (for example by switching off the radiation source 35). The template 34 is then typically offset by template handler (not shown) such that it is positioned in imprinting position 91 as shown in FIG. 9C. The template 34 may then be pressed into a layer of imprintable medium 33 overlying the first surface 32 of substrate 30.

Figure 10A:
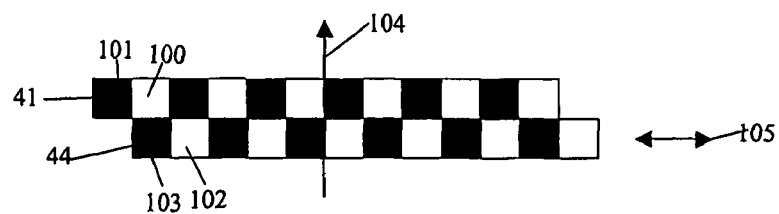
FIGS. 10A to 10C schematically illustrate alignment of a template alignment mark and an image of a substrate alignment mark in accordance with an embodiment of the present invention.
Figure 10B:
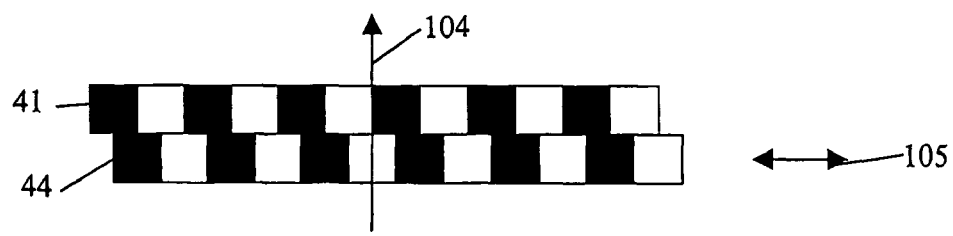
Figure 10C:
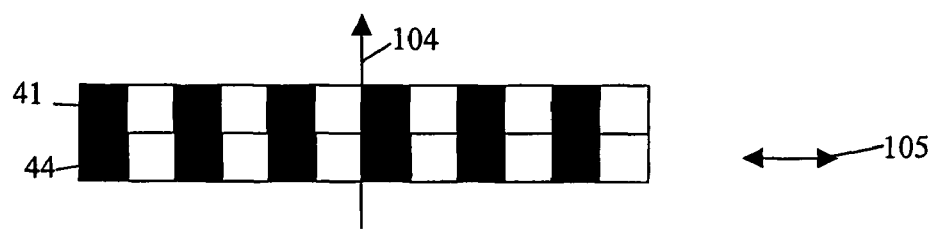

Referring now to FIGS. 10A to 10C, this illustrates the effect of relative movement between the template alignment mark 41 and the image 44 of the substrate alignment mark 39. Template alignment mark 41 comprises interspersed transparent grating elements 100 and opaque grating elements 101. The image 44 of the substrate alignment mark similarly comprises corresponding stripes of radiation 102 and gaps 103. For FIGS. 10A to 10C both the template and the substrate alignment marks comprise diffraction gratings having equal periods of stripes, such that the image 44 has an equal period of stripes to the template alignment mark 41. Arrow 104 indicates the passage of return radiation beam 40 though the template alignment mark 41.

Relative movement of the template 34 and the substrate 30 results in movement between the template alignment mark 41 and the image 44 in the plane of the template 34 (indicated by arrow 105). Three relative positions are shown. In a first relative position (FIG. 10A) the template alignment mark 41 and the image 44 are positioned such that all of the stripes of illumination 102 coincide with opaque grating elements 101. None of return radiation beam 40 reaches the radiation detector. In the third relative position (FIG. 10C) all of the stripes of illumination 102 line up with transparent grating elements such that all of the return radiation beam 40 reaches the radiation detector 36. The second relative position (FIG. 10B) illustrates an intermediate situation in which approximately half of the return radiation beam is incident upon the radiation detector 36.

Figure 11:
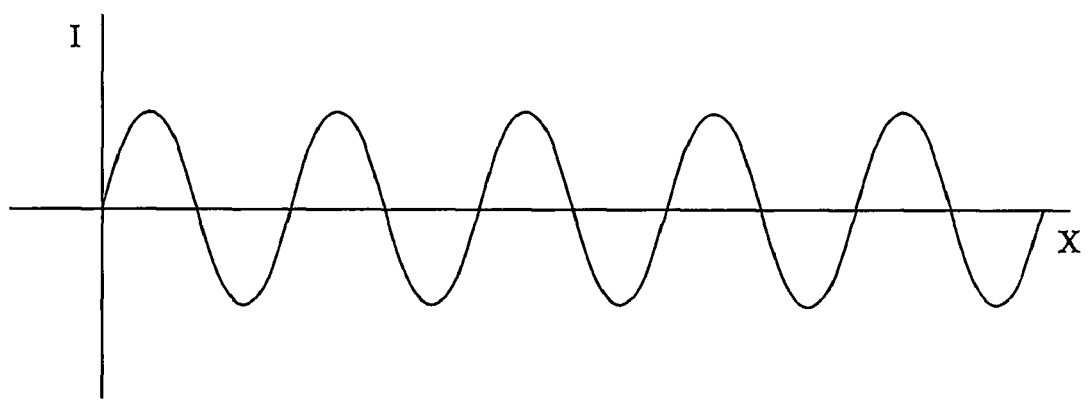
FIG. 11 schematically illustrates the variation in received radiation intensity with alignment of the template alignment mark and the image of the substrate alignment mark of FIG. 10.

Referring to FIG. 11, the intensity I of radiation received by the radiation detector 36 varies approximately as a sine wave as the position of the image of the substrate alignment mark 44 moves relative to the template alignment mark 41 in the direction of arrow 105 (indicated by the X axis). The intensity of received radiation can be measured by the radiation detector 36 and used to give an indication of the relative position of the template 34 and the substrate 30.

Figure 12:
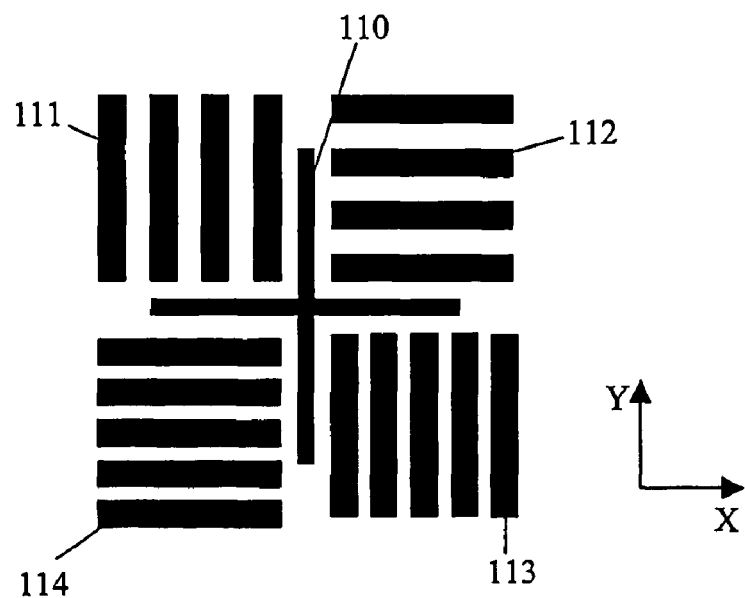
FIG. 12 schematically illustrates an alignment mark in accordance with an embodiment of the present invention.

Referring now to FIG. 12 this illustrates a form of alignment mark suitable for use in embodiments of the present invention. The same alignment mark is disposed on both the substrate 30 and the template 34. The alignment mark comprises a cross 110, which can be used to roughly align the alignment marks simply by adjusting the relative positions until the cross on the image 44 of the substrate alignment mark 39 and the cross on the template alignment mark 41 approximately coincide.

Each alignment mark further comprises four diffraction gratings 111-114 arranged into pairs 111, 113 and 112, 114 in orthogonal directions. This allows alignment of the template 34 and the substrate 30 to be achieved in two orthogonal directions in a plane parallel to the first surface 32 of the substrate 30. Each pair of diffraction gratings comprises a diffraction grating having a first period (111 and 112 respectively) and a diffraction grating having a second different period (113 and 114 respectively).

The radiation detector 36 comprises four detectors, each detector arranged to receive radiation passing through a separate diffraction grating on the template alignment mark 41. For this detection system, in order to prevent higher order diffraction beams from interfering with the radiation detector it is desirable to incorporate a spatial filter to filter out diffraction beams above the first order. As the template alignment mark 41 and the image 44 of the substrate alignment mark are moved relative to each other, the intensity pattern of received radiation for each diffraction grating varies approximately as a sine wave (as in FIG. 11).

Figure 13:
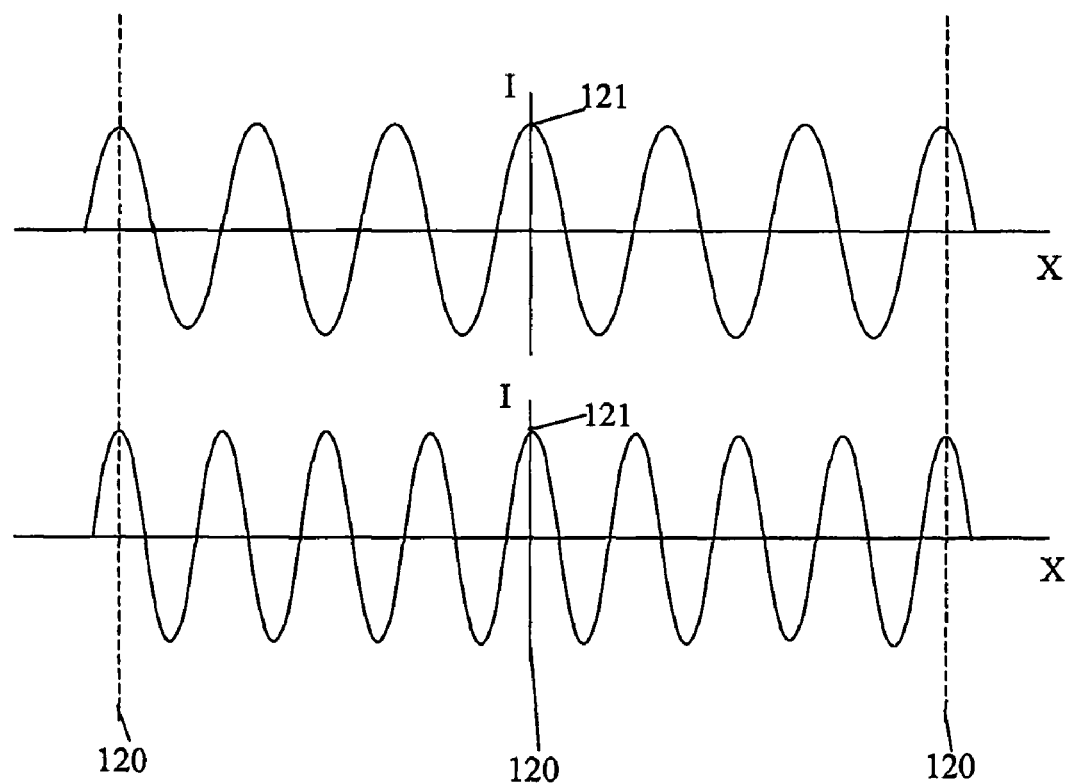
FIG. 13 schematically illustrates the variation in received radiation intensity with alignment of an template alignment mark and an image of the substrate alignment mark in accordance with FIG. 12.

FIG. 13 illustrates the received radiation intensity for a first pair of diffraction gratings 111, 113 as the alignment marks are moved relative to each other along the X axis. It can be seen that the peaks of the two sine waves only line up periodically at points 120 as the alignment marks move relative to each other due to the pair of diffraction gratings having different periods. It will be readily apparent that as long as the approximate alignment of the alignment marks is known to an accuracy of less than half the gap along the X axis between points 120 then the alignment marks may be accurately aligned by moving the template 34 relative to the substrate 30 until the peaks 121 of the pair of received radiation intensity patterns line up.

As an alternative, a detector system may be implemented in which higher order diffraction beams, for instance up to the $7^{th}$ order, from the substrate alignment mark 39 are separately passed to a plurality of separate detectors. Each detector comprises a separate diffraction grating (or pattern of diffraction gratings as shown in FIG. 12) and an associated detector. This can provide increased accuracy. As a further alternative, the periods of the diffraction gratings may vary between the substrate alignment mark and the template alignment mark. By having two different diffraction grating periods the return radiation beam incident upon the radiation detector forms a Moiré fringe pattern at the radiation detector. A Moiré fringe moves faster across the radiation detector than the corresponding relative movement between the template and the substrate. Consequently, improved accuracy of alignment can be achieved.

Alternatively, the alignment system may be arranged to look at the substrate alignment mark 39, i.e. without an intervening template alignment mark. Although not providing as accurate alignment as a system incorporating a template alignment mark, this approach is still advantageous as movement of the substrate alignment mark may be monitored without being obscured by a layer of imprintable medium, or by processing the imprintable surface of the substrate.

As a further option to improve the alignment accuracy, a magnifying lens is incorporated into the beam path of the return radiation beam. The magnifying lens could be combined with one of the focusing lenses 56, 57, such that a separate lens is not required.

By providing an alignment system able to operate with a substrate alignment mark on the second surface (i.e. the back side) of the substrate, an embodiment of the present invention is able reduce alignment errors caused by the alignment mark or marks being damaged by processing of the front side of the substrate in between imprinting steps. Consequently, the achievable alignment accuracy does not vary from one imprinting step to the next. Furthermore, as an alignment beam does not pass through a liquid layer there is no distortion. This increases the achievable alignment accuracy. Global alignment of the template to the substrate is possible, increasing throughput compared with a local alignment scheme. In an embodiment of the present invention, the achievable alignment accuracy is to within 50 nm in any direction within a plane parallel to a surface of the substrate. Advantageously, the alignment accuracy is to within 20 nm.

In an embodiment of the present invention, the or each radiation source is arranged to provide an alignment beam comprising at least two component wavelengths. This is advantageous because for certain diffraction grating periods, some wavelengths within the return radiation beam may destructively self interfere due to different portions of the beam reflecting off different portions of the diffraction grating. Providing a range of wavelengths in the alignment beam reduces this effect, either by averaging out the error or by allowing weak component wavelengths within the return radiation beam to be discounted by the radiation detector.

Although the above described embodiment of the invention relates to an alignment system which is located on an opposite side of the substrate from the alignment mark (i.e. the alignment system is above the substrate), it will be appreciated that the alignment system may be located on the same side of the substrate as the alignment mark (i.e. the alignment system is below the substrate).

An advantage of the present invention is that by providing the substrate alignment mark on the second surface of the substrate, i.e. the side of the substrate that is not imprinted, the substrate alignment mark is not affected by processing steps between imprinting steps. Consequently, the achievable alignment accuracy does not vary from one imprinting step to the next. Furthermore, as an alignment beam does not pass through a liquid layer there is no distortion. This increases the achievable alignment accuracy. Global alignment of the template to the substrate is possible, increasing throughput compared with a local alignment scheme.

While the above described embodiments of an alignment system in accordance with the present invention are primarily concerned with UV imprint lithography, the invention is not limited to this. For other forms of imprint lithography not having transparent templates the return radiation beam is reflected from the template alignment mark towards a radiation detector. The radiation detector is constructed and arranged to detect the alignment mark on the not transparent template from the side of the substrate table and to detect the substrate alignment mark on the second surface of the substrate either simultaneously or at a different time. This makes alignment to non-transparent imprint templates more easy to achieve. Further modifications which may be made to the alignment system will be readily apparent to the appropriately skilled person from the teaching herein.

Whilst specific examples of the invention have been described above, it will be appreciated that the present invention may be practiced otherwise than as described. The description is not intended to limit the invention.

The invention claimed is:

1. An imprint lithography apparatus for imprinting a substrate having a first surface to be imprinted and a second surface opposite the first surface, the second surface having a substrate alignment marking, the apparatus comprising:
   a substrate table arranged to support the substrate, with the second surface of the substrate facing the substrate table;
   a template holder arranged to hold a template comprising a template alignment mark, the template arranged to imprint the first surface of the substrate; and
   an alignment system arranged to align the template alignment mark to the substrate alignment mark on the substrate;
   wherein the substrate table comprises a substrate table optical system located in an optical cavity within the substrate table to allow the substrate alignment mark to be viewed by the alignment system, the substrate table optical system comprising at least one lens arranged to focus an image of the substrate alignment mark adjacent to the template alignment mark; and
   wherein the alignment system comprises a radiation source arranged to provide an alignment beam of radiation through the substrate table optical system to illuminate the substrate alignment mark with the alignment beam of radiation, and a radiation detector arranged to receive a return radiation beam from the substrate alignment mark after the return radiation beam has passed through the substrate table optical system and through the template.

2. An imprint lithography apparatus according to claim 1, wherein the alignment system further comprises a beam deflection element arranged to deliver the alignment beam to the substrate table optical system and deliver the return radiation beam to the radiation detector.

3. An imprint lithography apparatus according to claim 1, wherein the substrate table optical system is arranged to transmit the alignment beam and the return radiation beam along substantially the same beam path.

4. An imprint lithography apparatus according to claim 1, wherein the substrate table optical system is arranged to deflect the radiation between an optical window in the substrate table and the substrate alignment mark.

5. An imprint lithography apparatus according to claim 4, wherein the optical window is displaced from the substrate parallel to the plane of a surface of the substrate such that the substrate does not obstruct the beam path between the optical window and the radiation detector.

6. An imprint lithography apparatus according to claim 1, wherein the template further comprises a functional pattern arranged to be imprinted into the first surface of the substrate, the template alignment mark being in a known spatial relationship to the functional pattern.

7. An imprint lithography apparatus according to claim 1, wherein the template comprises at least two spaced apart template alignment marks and the substrate comprises at least two spaced apart substrate alignment marks.

8. An imprint lithography apparatus according to claim 1, wherein the radiation detector is a photodetector arranged to measure the intensity of received radiation, and provide an output signal indicative of the intensity of the received radiation, and the substrate alignment mark and the template alignment mark comprise diffraction gratings arranged such that the intensity of radiation received by the radiation detector varies according to the relative positions of the diffraction gratings.

9. An imprint lithography apparatus according to claim 1, wherein the radiation detector is a photodetector arranged to measure the intensity of received radiation and provide an output signal indicative of the position of the template relative to the substrate.

10. An imprint lithography apparatus according to claim 1, wherein the alignment beam comprises at least two component beams having different wavelengths of radiation.

11. An imprint lithography apparatus according to claim 1, further comprising a magnifying lens arranged such that an image of the substrate alignment mark is magnified.

12. An imprint lithography apparatus according to claim 1, wherein the apparatus is arranged to align the template with the substrate alignment mark to within 20 nm in a direction parallel to the plane of the first surface of the substrate.

13. An imprint lithography apparatus for imprinting a substrate, the substrate having a substrate alignment mark, the apparatus comprising:
a substrate table arranged to support the substrate;
a template holder arranged to hold a template comprising a template alignment mark, the template configured to imprint the substrate; and
an alignment system arranged to align the template alignment mark to the substrate alignment mark on the substrate,
wherein the substrate table comprises a substrate table optical system located in an optical cavity within the substrate table to allow the substrate alignment mark to be viewed by the alignment system, the substrate table optical system comprising at least one lens arranged to focus an image of the substrate alignment mark adjacent to the template alignment mark; and
wherein the alignment system comprises a radiation source arranged to provide an alignment beam of radiation through the substrate table optical system to illuminate the substrate alignment mark with the alignment beam of radiation, and a radiation detector arranged to receive a return radiation beam from the substrate alignment mark after the return radiation beam has passed through the substrate table optical system and through the template.

14. An imprint lithography apparatus for imprinting a substrate, the substrate having a substrate alignment mark, the apparatus comprising:
a substrate table arranged to support the substrate; and
an alignment system arranged to align the substrate alignment mark on the substrate with a template alignment mark on a template, the template configured to imprint the substrate,
wherein the substrate table comprises a substrate table optical system located in an optical cavity within the substrate table to allow the substrate alignment mark to be viewed by the alignment system, the substrate table optical system comprising at least one lens arranged to focus an image of the substrate alignment mark adjacent to the template alignment mark; and
wherein the alignment system comprises a radiation source arranged to provide an alignment beam of radiation through the substrate table optical system to illuminate the substrate alignment mark with the alignment beam of radiation, and a radiation detector arranged to receive a return radiation beam from the substrate alignment mark after the return radiation beam has passed through the substrate table optical system.

* * * * *